(12) United States Patent
Lilak et al.

(10) Patent No.: US 10,573,715 B2
(45) Date of Patent: Feb. 25, 2020

(54) BACKSIDE ISOLATION FOR INTEGRATED CIRCUIT

(71) Applicant: Intel Corporation, Santa Clara, CA (US)

(72) Inventors: Aaron D. Lilak, Beaverton, OR (US); Rishabh Mehandru, Portland, OR (US); Harold W. Kennel, Portland, OR (US); Paul B. Fischer, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/775,786

(22) PCT Filed: Dec. 17, 2015

(86) PCT No.: PCT/US2015/066501
§ 371 (c)(1),
(2) Date: May 11, 2018

(87) PCT Pub. No.: WO2017/105471
PCT Pub. Date: Jun. 22, 2017

(65) Prior Publication Data
US 2018/0331183 A1 Nov. 15, 2018

(51) Int. Cl.
*H01L 29/10* (2006.01)
*H01L 23/00* (2006.01)
(Continued)

(52) U.S. Cl.
CPC .... *H01L 29/1083* (2013.01); *H01L 21/76224* (2013.01); *H01L 21/823431* (2013.01);
(Continued)

(58) Field of Classification Search
CPC . H01L 29/1083; H01L 29/0649; H01L 29/78; H01L 21/76224; H01L 21/823481;
(Continued)

(56) References Cited

U.S. PATENT DOCUMENTS 5,448,168 A 9/1995 Hirano et al.
8,895,446 B2 * 11/2014 Peng ................. H01L 21/76224
438/700
(Continued)

FOREIGN PATENT DOCUMENTS

EP 2913847 A1 9/2015

OTHER PUBLICATIONS

International Search Report and Written Opinion dated Aug. 19, 2016 for International Application No. PCT/US2015/066501, 12 pages.
(Continued)

*Primary Examiner* — Yosef Gebreyesus
(74) *Attorney, Agent, or Firm* — Scwabe, Williamson & Wyatt, P.C.

(57) ABSTRACT

Embodiments of the present disclosure describe techniques for backside isolation for devices of an integrated circuit (IC) and associated configurations. The IC may include a plurality of devices (e.g., transistors) formed on a semiconductor substrate. The semiconductor substrate may include substrate regions on which one or more devices are formed. Trenches may be disposed between the devices on the semiconductor substrate. Portions of the semiconductor substrate between the substrate regions may be removed to expose the corresponding trenches and form isolation regions. An insulating material may be formed in the isolation regions. Other embodiments may be described and/or claimed.

7 Claims, 9 Drawing Sheets

(51) Int. Cl.
*H01L 29/78* (2006.01)
*H01L 23/48* (2006.01)
*H01L 21/762* (2006.01)
*H01L 21/8234* (2006.01)
*H01L 27/088* (2006.01)
*H01L 29/06* (2006.01)

(52) U.S. Cl.
CPC ...... *H01L 21/823481* (2013.01); *H01L 23/48* (2013.01); *H01L 24/16* (2013.01); *H01L 27/088* (2013.01); *H01L 27/0886* (2013.01); *H01L 29/0649* (2013.01); *H01L 29/78* (2013.01); *H01L 2224/16225* (2013.01); *H01L 2924/00014* (2013.01); *H01L 2924/13067* (2013.01); *H01L 2924/13091* (2013.01); *H01L 2924/14* (2013.01); *H01L 2924/1431* (2013.01); *H01L 2924/1434* (2013.01); *H01L 2924/14335* (2013.01); *H01L 2924/15311* (2013.01)

(58) Field of Classification Search
CPC ... H01L 21/823431; H01L 2924/00014; H01L 2924/13067; H01L 2924/13091; H01L 2924/14; H01L 2924/1431; H01L 2924/14335; H01L 2924/1434; H01L 2924/15311
See application file for complete search history.

(56) References Cited

U.S. PATENT DOCUMENTS

| | | |
|---|---|---|
| 2006/0118906 A1 | 6/2006 | Kao et al. |
| 2009/0057812 A1 | 3/2009 | Akagi et al. |
| 2009/0160050 A1 | 6/2009 | Miyakawa et al. |
| 2014/0035041 A1 | 2/2014 | Pillarisetty et al. |
| 2014/0227857 A1* | 8/2014 | Youn ................ H01L 21/76229 438/427 |
| 2014/0367777 A1 | 12/2014 | Huang et al. |

OTHER PUBLICATIONS

Extended European Search Report dated Jun 6, 2019 for European Patent Application No. 15910938.8, 7 pages.

* cited by examiner

10,573,715 B2

BACKSIDE ISOLATION FOR INTEGRATED CIRCUIT

CROSS REFERENCE TO RELATED APPLICATIONS

The present application is a national phase entry under 35 U.S.C. § 371 of International Application No. PCT/US2015/066501, filed Dec. 17, 2015, entitled "BACKSIDE ISOLATION FOR INTEGRATED CIRCUIT", which designated, among the various States, the United States of America. The PCT/US2015/066501 Application is hereby incorporated by reference in its entirety.

FIELD

Embodiments of the present disclosure generally relate to the field of integrated circuits, and more particularly, to techniques for backside isolation in an integrated circuit and associated configurations.

BACKGROUND

In integrated circuits (ICs), many transistors and/or other devices are formed on a semiconductor substrate. However, there may be leakage current between the devices through the substrate. The leakage current may harm performance and/or increase power consumption of the IC.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
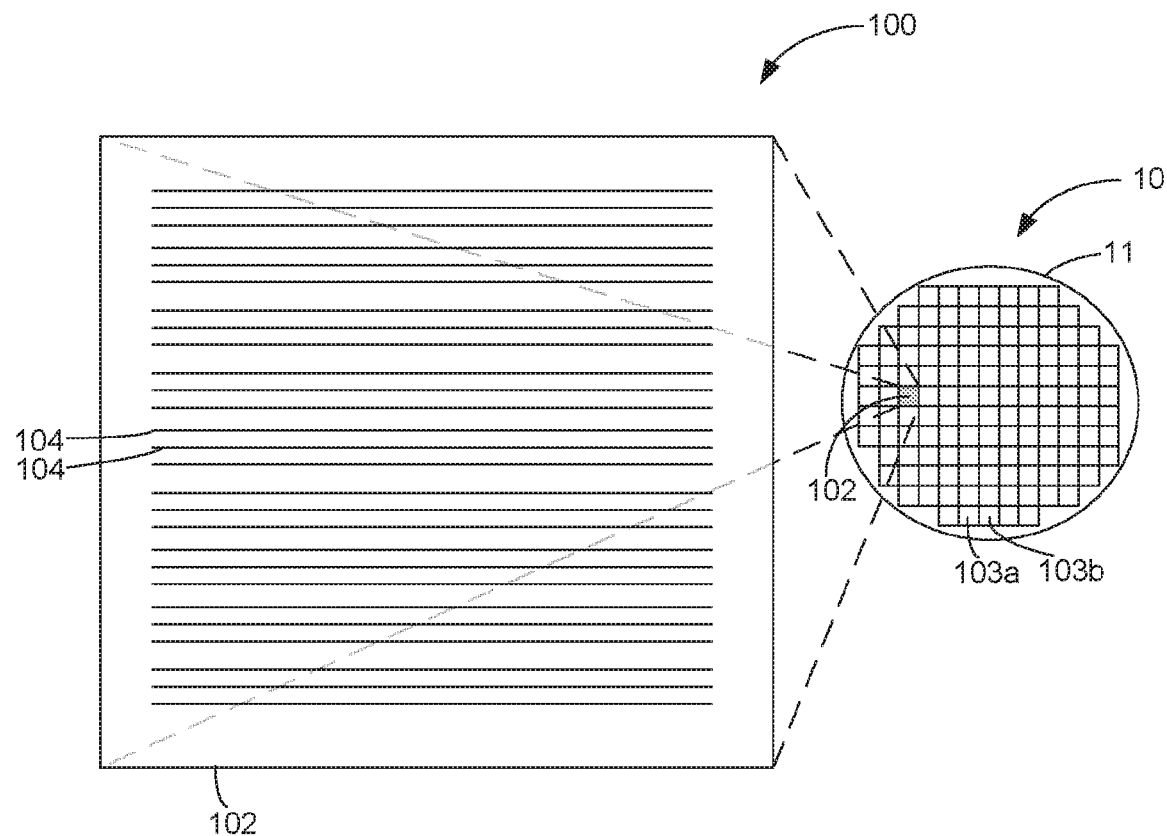
FIG. 1 schematically illustrates a top view of an example die in wafer form and in singulated form, in accordance with some embodiments.

Embodiments of the present disclosure describe techniques for backside isolation for devices of an integrated circuit (IC) and associated configurations. The IC may include a plurality of devices (e.g., transistors) formed on a semiconductor substrate. The semiconductor substrate may include substrate regions on which one or more devices are formed. Trenches may be disposed between the devices on the semiconductor substrate. Portions of the semiconductor substrate between the substrate regions may be removed to expose the corresponding trenches and form isolation regions. An insulating material may be formed in the isolation regions. The isolation regions may prevent or reduce leakage current between devices of different substrate regions, thereby improving operation and/or lowering power consumption of the IC.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more ICs (e.g., IC 400 and/or an IC formed using method 300) as described herein. For example, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
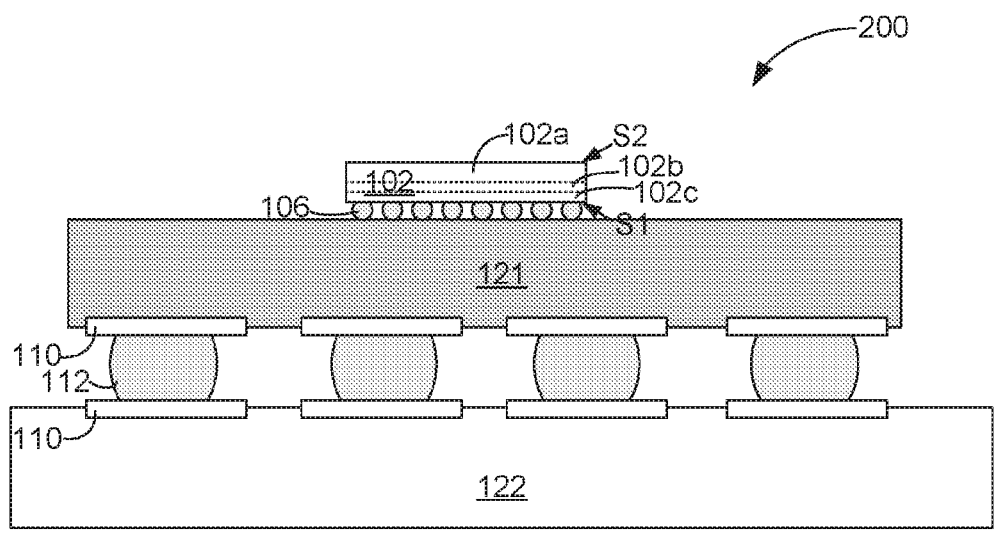
FIG. 2 schematically illustrates a cross-section side view of an integrated circuit (IC) assembly, in accordance with some embodiments.

FIG. 2 schematically illustrates a cross-section side view of an IC assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an IC assembly 200 may include one or more of the die 102, package substrate 121 and/or circuit board 122, according to various embodiments. Embodiments described herein for an IC structure may be implemented in any suitable IC device according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments. In accordance with various embodiments, the semiconductor substrate 102a may include a plurality of substrate regions with isolation regions disposed between the substrate regions. In some embodiments, an isolation material may be disposed in the isolation regions.

The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts. In various embodiments, one or more layers of the interconnect layer 102c may include a replacement ILD as described further below.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1002 of FIG. 10).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
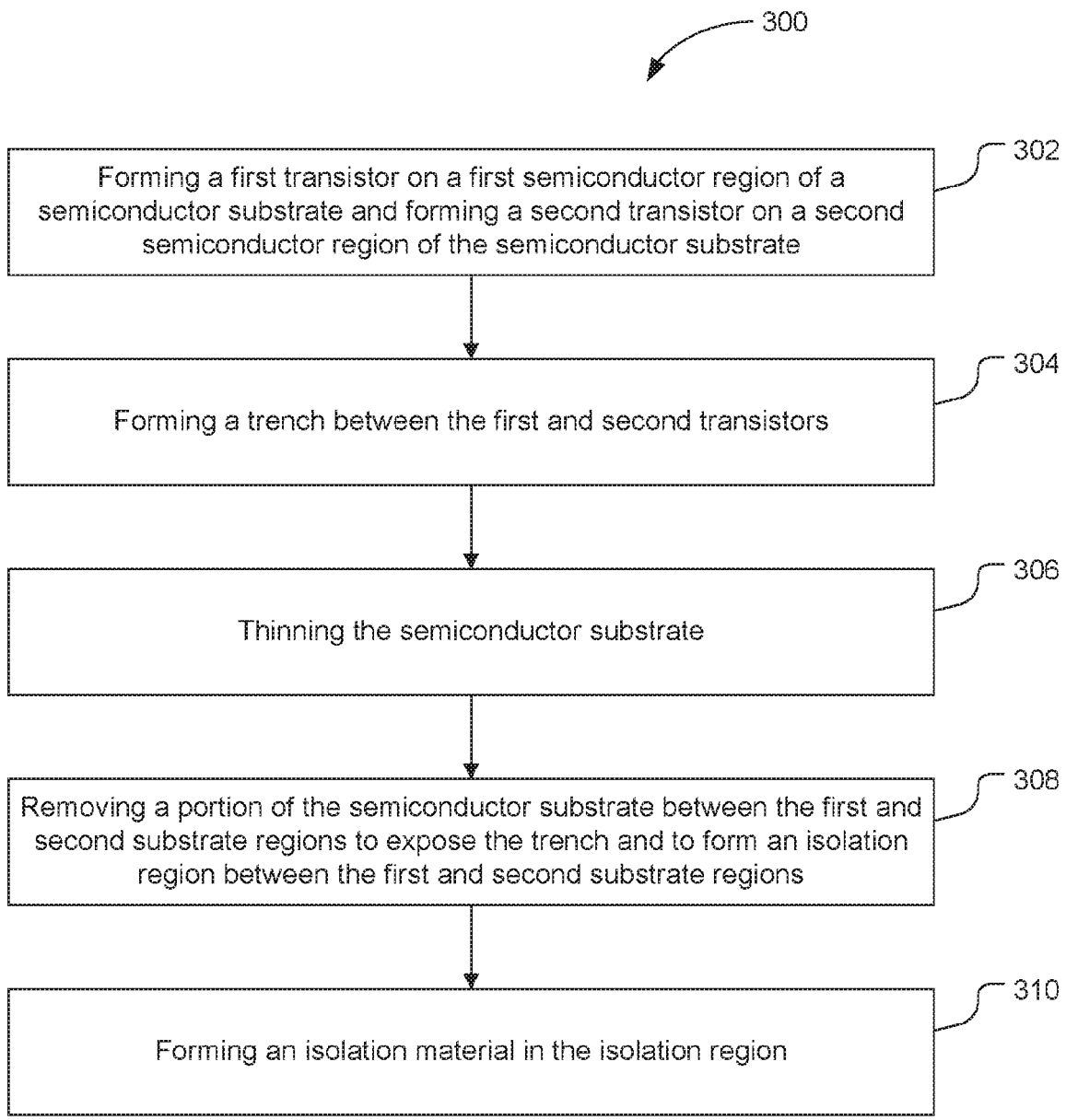
FIG. 3 is a flow diagram that illustrates a process for electrically isolating substrate regions of a semiconductor substrate of an IC, in accordance with some embodiments.

FIG. 3 is an illustrative flow diagram of a backside isolation process 300 (hereinafter "process 300") that may be performed to electrically isolate different substrate regions of a semiconductor substrate of an IC from one another, in accordance with various embodiments. In some embodiments, some or all of the process 300 may be performed on a semiconductor wafer that includes a plurality of ICs disposed thereon.

FIGS. 4A, 4B, 5A, 5B, 7A, 7B, 8A, 8B, 9A, and 9B schematically illustrate cross-sectional side views of an IC 400 at various stages of the process 300, in accordance with various embodiments. Accordingly, the process 300 will be described below with reference to FIGS. 4A, 4B, 5A, 5B, 7A, 7B, 8A, 8B, 9A, and 9B. FIGS. 4A, 5A, 7A, 8A, and 9A illustrate a cross-sectional side view of the IC 400 in a first plane, and FIGS. 4B, 5B, 7B, 8B, and 9B illustrate a cross-sectional side view of the IC 400 in a second plane that is orthogonal to the first plane.

At block 302, the process 300 may include forming a first transistor on a first semiconductor region of a semiconductor substrate and forming a second transistor on a second semiconductor region of the semiconductor substrate. In some embodiments, the first and second transistors may be fin field-effect transistors (finFETs) that include a semiconductor fin formed on the respective semiconductor region. Alternatively, the first and second transistors may be planar transistors. The first and second transistors may be formed on a first side (e.g., front side) of the respective semiconductor region.

In some embodiments, the first transistor may be the only transistor on the first substrate region. Alternatively, one or more additional transistors may be formed on the first substrate region. That is, the process 300 may be used to isolate individual devices (e.g., transistors) from one another and/or to isolate groups of devices from other groups of devices.

At block 304, the process 300 may include forming a trench between the first and second transistors. If the first and second transistors are finFETs, the trench may be disposed between the fins of the first and second transistors. The trench may include an insulating material, such as an oxide, nitride, and/or another suitable material.

Figure 4A:
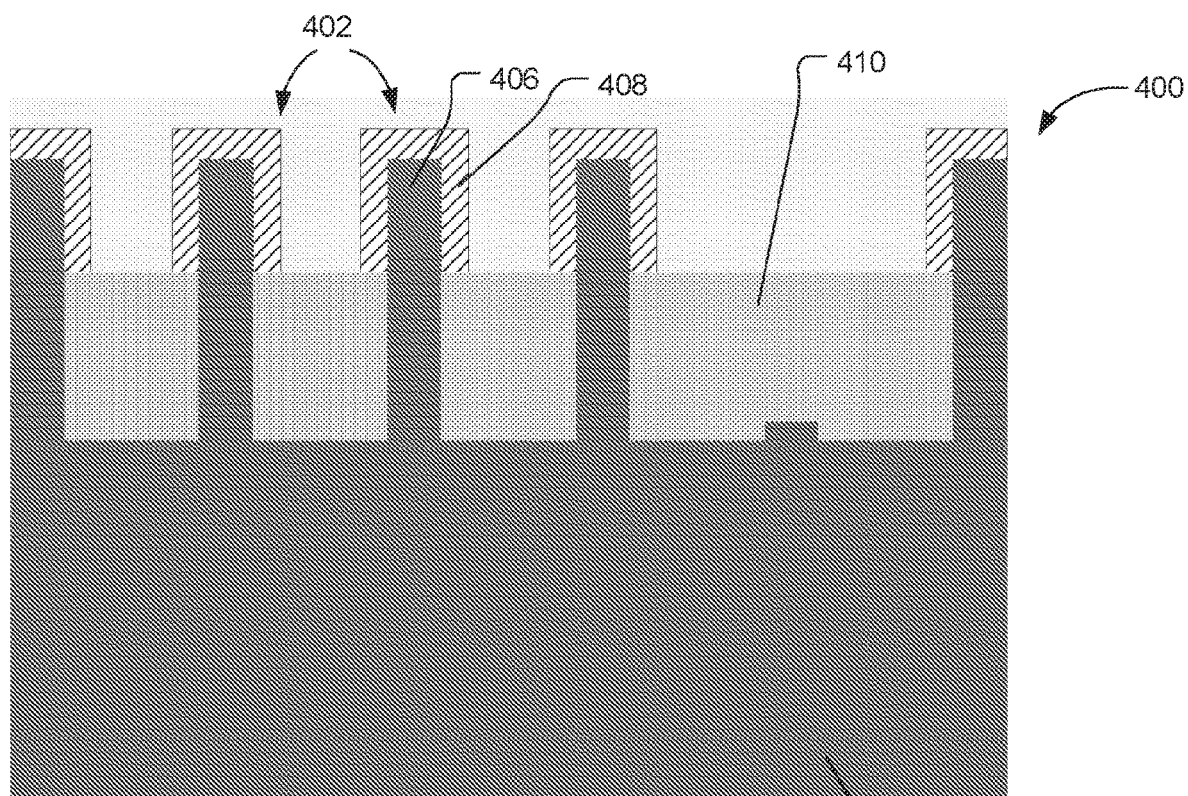
FIGS. 4A, 5A, 7A, 8A, and 9A schematically illustrate a cross-section side view, in a first plane, of an IC during various stages of the process of FIG. 3, in accordance with some embodiments.
Figure 4B:
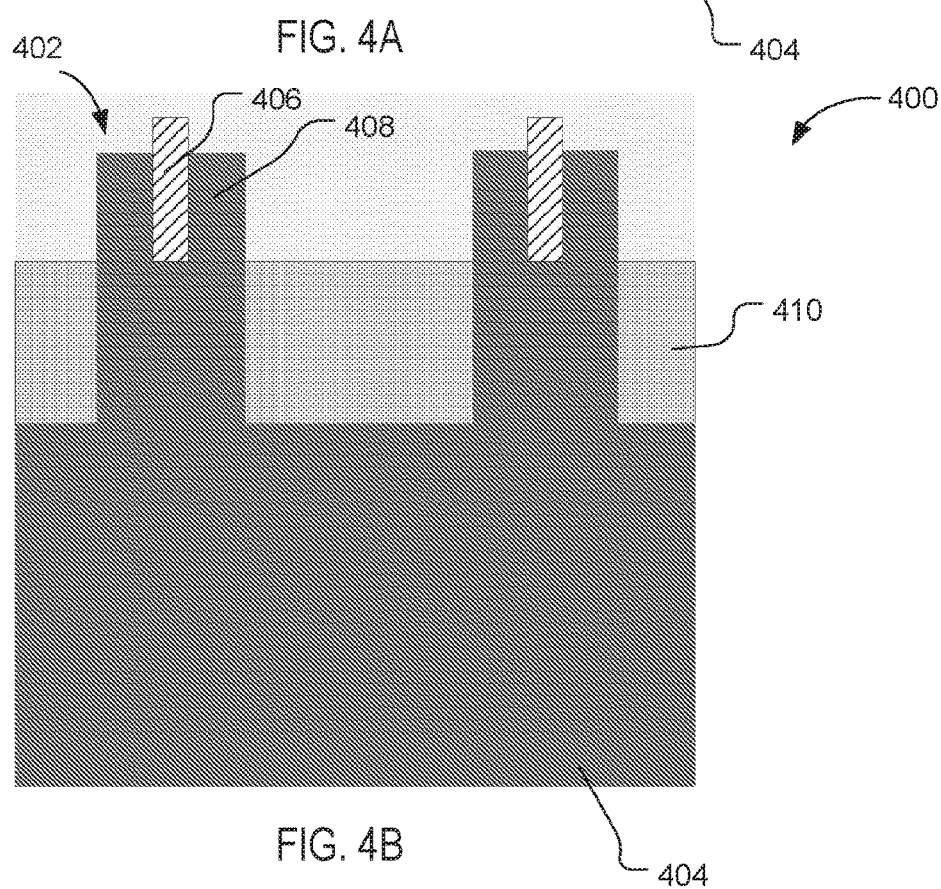
FIGS. 4B, 5B, 7B, 8B, and 9B schematically illustrate a cross-section side view, in a second plane that is orthogonal to the first plane, of the IC of FIGS. 4A, 5A, 7A, 8A, and 9A during various stages of the process of FIG. 3, in accordance with some embodiments.

FIGS. 4A and 4B illustrate an IC 400 in accordance with various embodiments. The IC 400 includes a plurality of transistors 402 formed on different substrate regions of a semiconductor substrate 404. The individual transistors 402 include a fin 406 that extends from the substrate 404. The fins 406 may be formed of a semiconductor material, such as the semiconductor material of the substrate 404. The individual transistors 402 may further include a gate terminal 408 coupled to the respective fin 406. The gate terminals 408 may be formed of a conductor, such as a metal.

The IC 400 may further include trenches 410 disposed between the transistors 402. In some embodiments, the trenches 410 may be disposed between lower portions of the fins 406, and the gate terminals 408 may be disposed on the trenches 410. The trenches 410 may be formed of an insulating material, such as an oxide, a nitride, and/or another suitable material. For example, suitable insulating materials for the trenches 410 may include, but are not limited to silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), carbon doped oxide (CDO), silicon nitride (SiN), or combinations thereof, where x, y, and z represent suitable quantities of the respective elements.

Although the backside isolation techniques described herein are described with reference to finFETs, the backside isolation techniques may be applied to ICs that include other types of transistors, in accordance with various embodiments. For example, in some embodiments, the IC may include planar transistors. Such ICs may include shallow trench isolation (STI) regions that separate semiconductor regions. The STIs may be formed in the semiconductor substrate by etching into the substrate to form recesses and filling the recesses with an isolation oxide. The semiconductor regions may be doped semiconductor wells, such as n-type doped wells (e.g., to form p-type transistors) or p-type doped wells (e.g., to form n-type transistors). The semiconductor substrate below the STI regions may be removed as described herein.

Referring again to FIG. 3, at block 306 the process 300 may include thinning the semiconductor substrate (e.g., removing a portion of the semiconductor substrate to reduce the thickness of the semiconductor substrate). The semiconductor substrate may be thinned using one or more techniques, such as mechanical grinding, etching (e.g., wet etching), and/or chemical mechanical planarization (CMP).

In some embodiments, after thinning, the semiconductor substrate may have a thickness of 10 nanometers to 200 nanometers.

In some embodiments, prior to thinning the semiconductor substrate at block 306, the wafer of ICs may be flipped and the top side of the wafer (e.g., the top side of the ICs) may be bonded to a carrier wafer. The top side processing of the ICs (e.g., forming the first and second transistors at block 302 and/or forming the trenches at block 304) may be performed on the semiconductor substrate with the top side facing up, and the wafer of ICs may then be flipped and bonded with the carrier wafer with the top side facing down.

The carrier wafer may be any suitable material, such as silicon, gallium arsenide (GaAs), glass, and/or another material. The carrier wafer may be bonded to the top side of the wafer of ICs by any suitable mechanism, such as oxide fusion bonding, metallic bonding, or adhesive bonding. Additionally, the carrier wafer may be temporarily or permanently bonded to the ICs. By temporarily bonded, it is meant that the carrier wafer is removed after the process 300 is performed. By permanently bonded, it is meant that the carrier wafer remains bonded to the ICs in their final form (e.g., when the IC is incorporated into an IC package such as IC package 200). In some embodiments, the carrier wafer may include routing features to route electrical signals between the IC device 410 and one or more other devices.

Figure 5A:
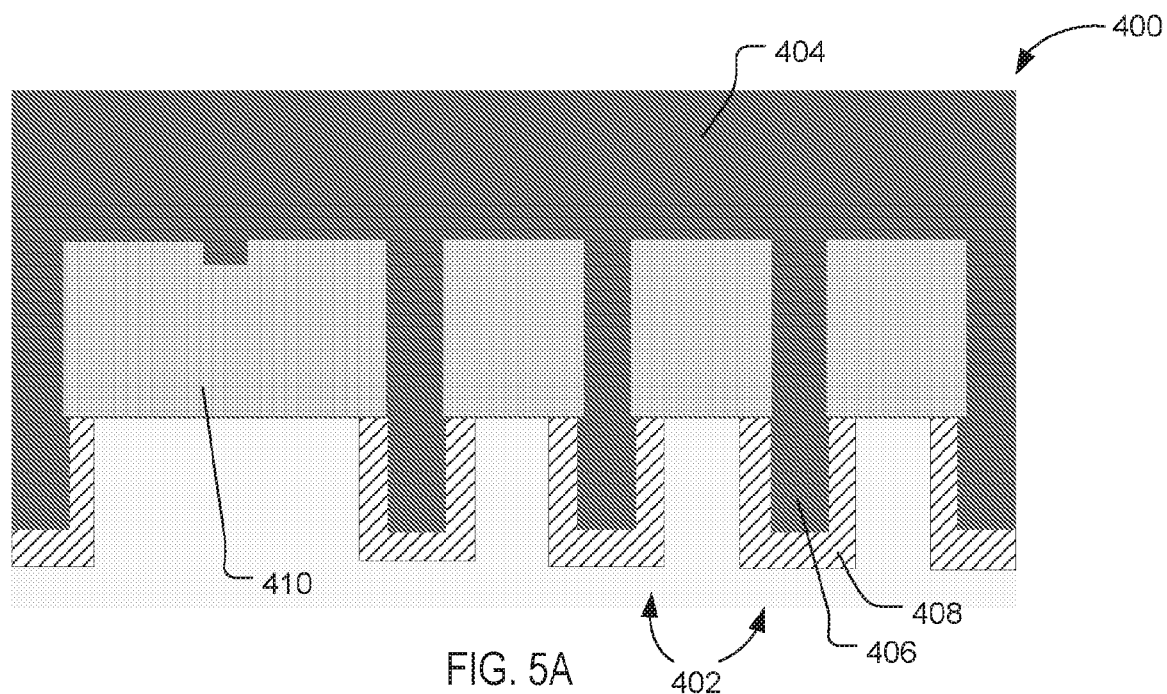
Figure 5B:
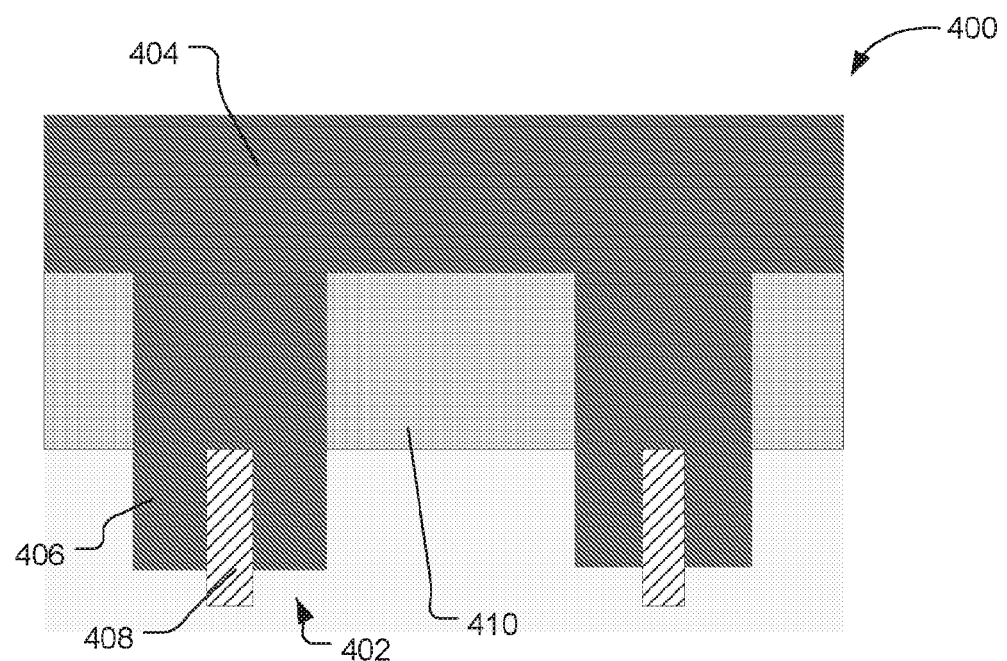

FIGS. 5A and 5B illustrate the IC 400 after the IC 400 has been flipped and bonded to a carrier wafer (not shown), and the semiconductor substrate 404 has been thinned. It should be noted that the thickness of the substrate 404 is not drawn to scale in FIGS. 4A-B and 5A-B. The thickness of the substrate 404 may be reduced significantly more by the thinning process than what is shown by FIGS. 4A-B and 5A-B.

At block 308, the process 300 may include removing a portion of the semiconductor substrate between the first and second substrate regions to expose the trench and to form an isolation region between the first and second substrate regions. For example, one or more materials, such as a resist material, may be deposited on the backside of the first and second substrate regions, and then the portion of the semiconductor substrate between the first and second substrate regions may be removed by an etching process. In addition to or instead of the resist material, the one or more materials deposited on the backside of the first and second substrate regions may include one or more anti-reflective layers, etch stop layers, and/or hard mask layers. In some embodiments, the trench may act as an etch stop layer for the etching process. The resist material may be resistant to the etching process, thus preventing the substrate regions under the resist material from being removed. For example, the etching process may include applying an etchant to the backside of the IC, where the etchant is selective for the substrate material compared with the resist material and the trench material. Accordingly, the etching process may remove the substrate material between the first and second substrate regions to expose the trench and form the isolation region.

Figure 6:
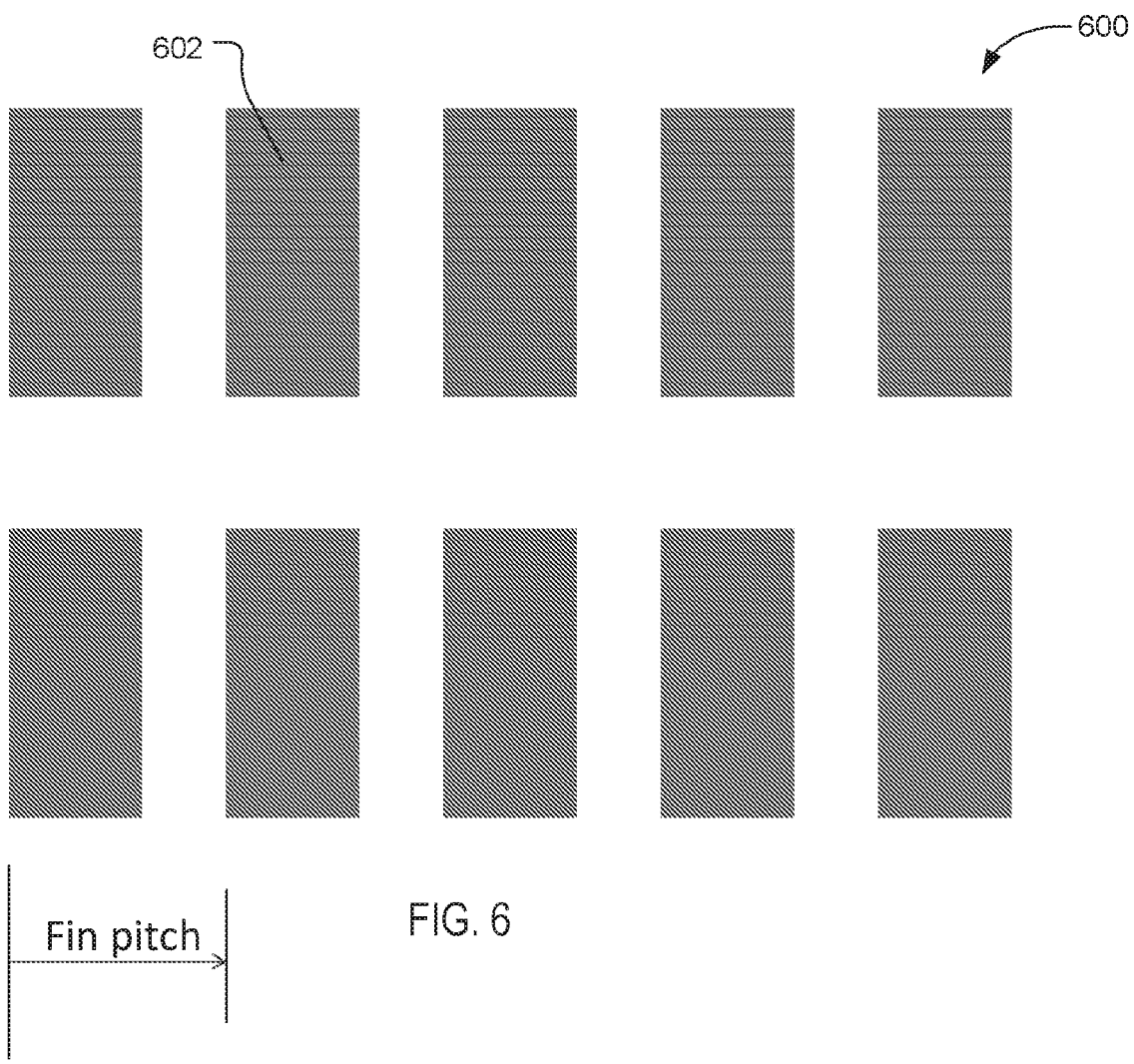
FIG. 6 schematically illustrates a top view of a mask that is used to deposit a resist material on the backside of the semiconductor substrate of the IC of FIGS. 4A-B, 5A-B, 7A-B, 8A-B, and 9A-B.

In various embodiments, the resist material may be patterned on the backside of the first and second substrate regions using a mask. For example, FIG. 6 illustrates a top view of a mask 600 that may be used to pattern a resist material onto the semiconductor portions of the semiconductor substrate 404 of IC 400. Mask 600 includes mask regions 602 that correspond to the semiconductor portions of the semiconductor substrate 404 on which the resist material is formed.

Figure 7A:
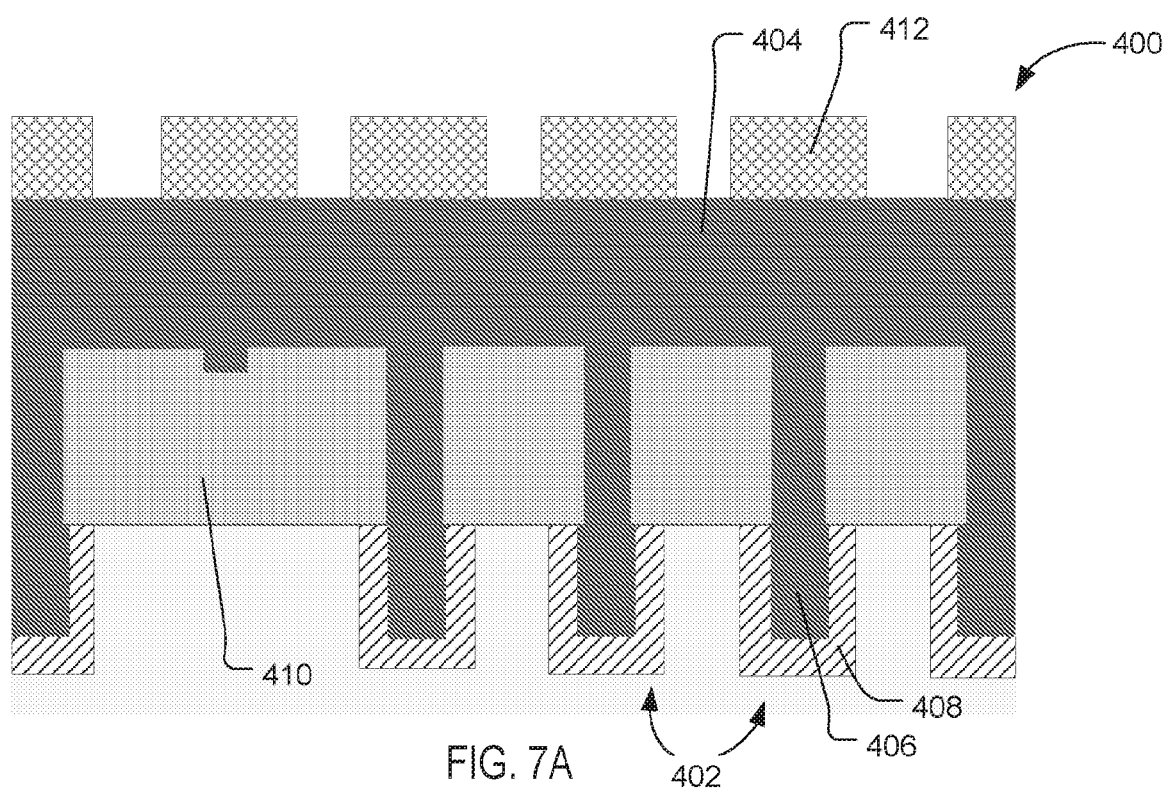
Figure 7B:
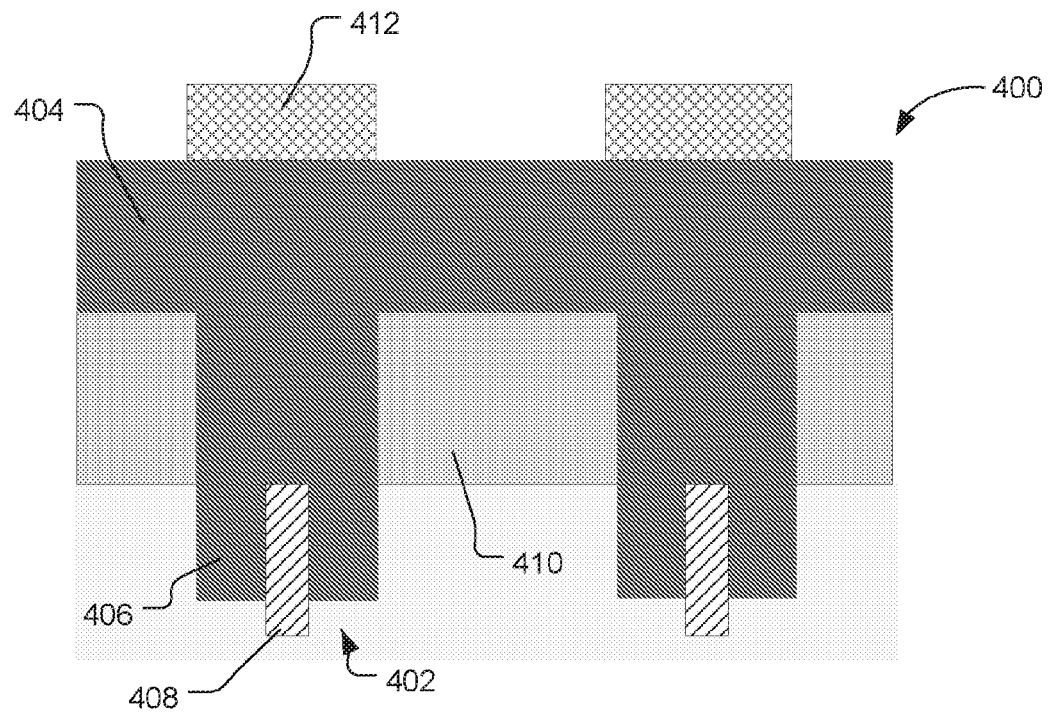
Figure 8A:
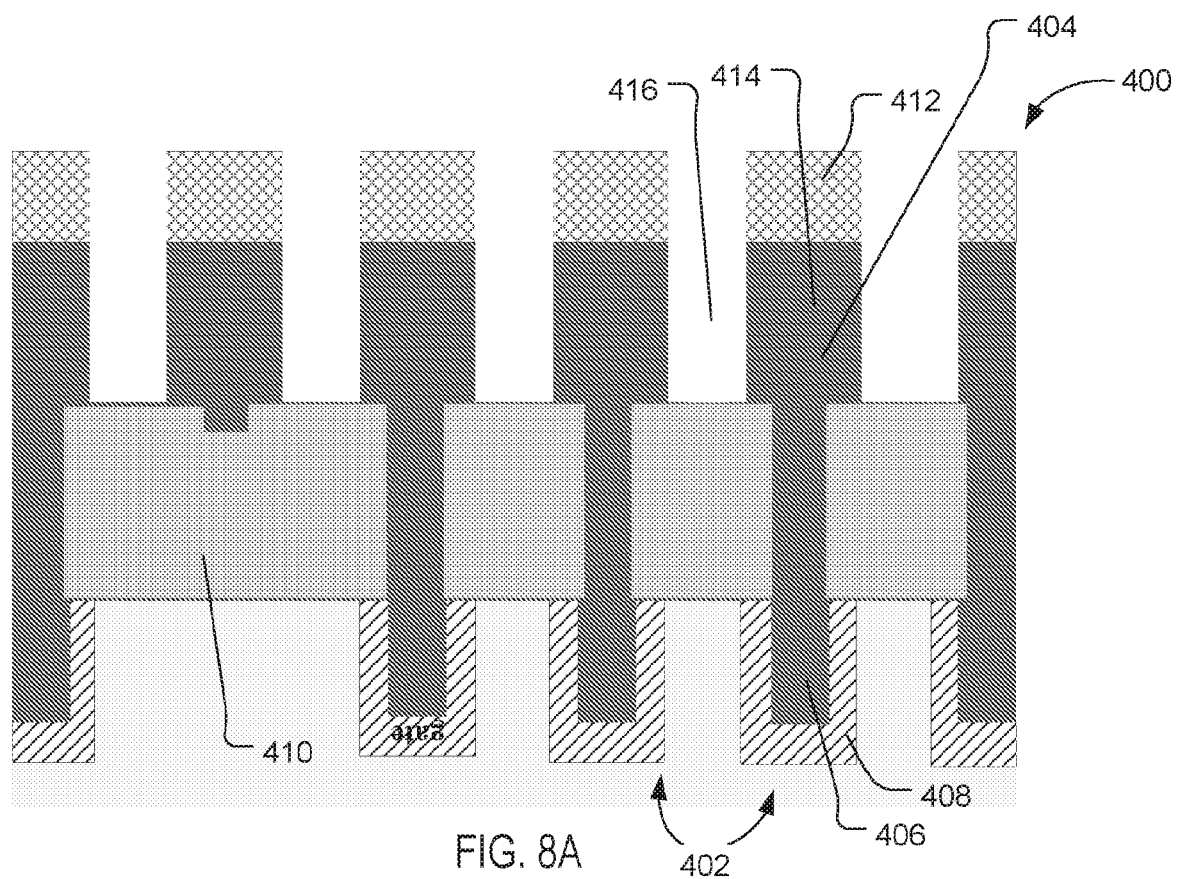
Figure 8B:
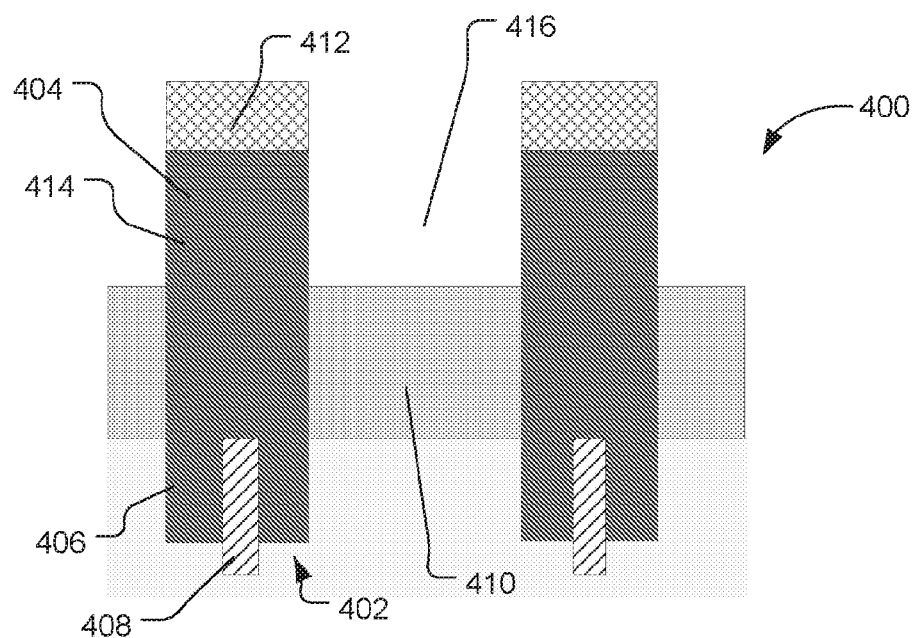

FIGS. 7A and 7B illustrate the IC 400 with resist material 412 formed on the backside of the semiconductor regions of the substrate 404. FIGS. 8A and 8B illustrate the IC 400 with portions of the semiconductor substrate between substrate regions 414 removed to form isolation regions 416. The isolation regions 416 may extend from the trench 410 to a second side (e.g., backside) of the substrate regions 414.

Referring again to FIG. 3, at block 310 the process 300 may include forming an isolation material in the isolation region (e.g., on and in contact with the trench). The isolation material may be an insulating material, such as an oxide, a nitride, and/or another suitable material. For example, suitable insulating materials for the isolation material may include, but are not limited to silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_7O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), carbon doped oxide (CDO), silicon nitride (SiN), or combinations thereof, where x, y, and z represent suitable quantities of the respective elements. The isolation material may be the same material or a different material from the trench.

Figure 9A:
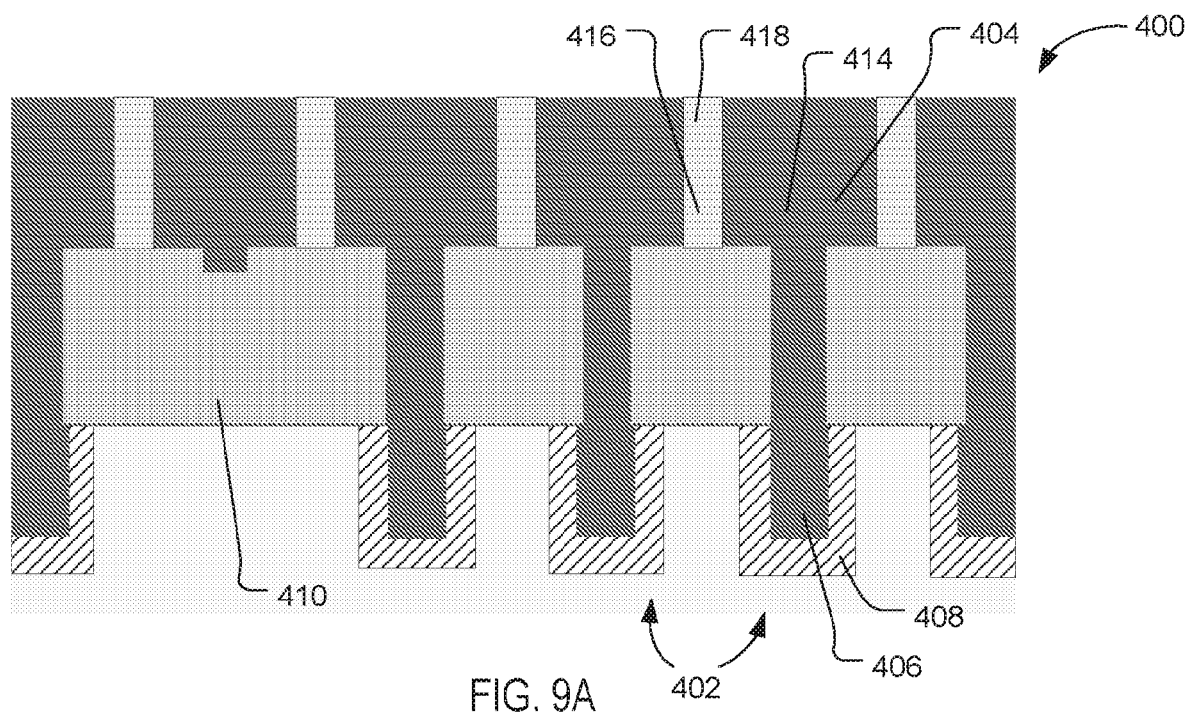
Figure 9B:
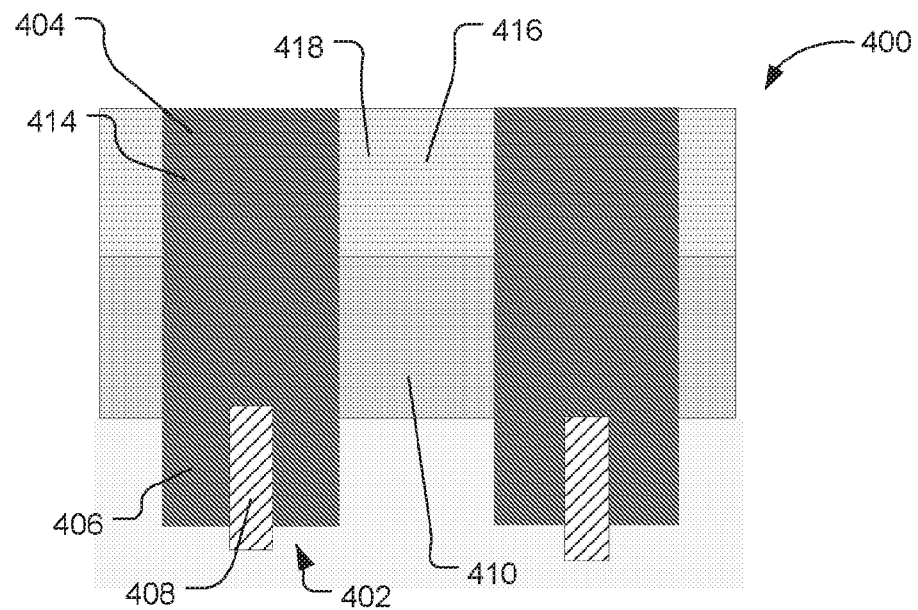

FIGS. 9A and 9B illustrate the IC 400 with isolation material 418 disposed in the isolation regions 416 and in contact with the trenches 410. The isolation material 418 and/or isolation regions 416 may prevent or reduce leakage current between the transistors 402a-f through the semiconductor substrate 404. The reduced leakage may improve performance and/or provide lower power consumption for the IC 400.

In other embodiments, an isolation material may not be deposited in the isolation regions 416. Accordingly, the isolation regions 416 may be filled with air. The air may act as an insulator to prevent or reduce current between the semiconductor regions. A capping layer may be formed on the substrate regions 414 to trap air in the isolation regions 416.

In some embodiments, further structures may be formed on the backside of the IC 400 after the isolation regions are formed. For example, in some embodiments, one or more interconnect layers may be formed on the backside of the IC after the isolation regions are formed.

In some embodiments, such as embodiments in which the carrier wafer is a temporary wafer, the backside of the IC 400 may be bonded to a permanent wafer after the isolation regions are formed. The permanent wafer may be any suitable material, and may or may not be a semiconductor. For example, the permanent wafer may be silicon, glass, and/or another suitable material.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 10:
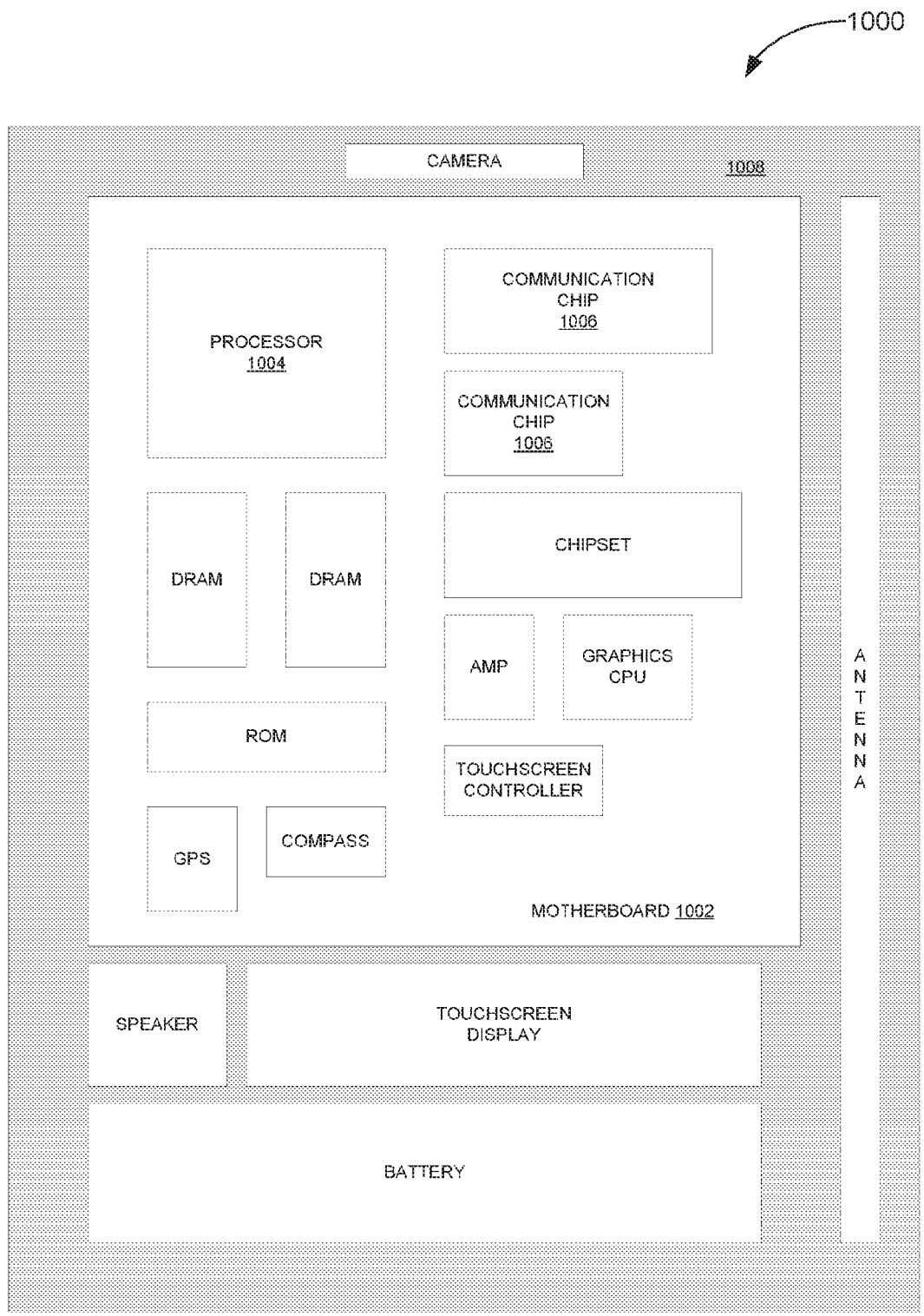
FIG. 10 schematically illustrates an example system that may include an IC device as described herein, in accordance with some embodiments.

FIG. 10 schematically illustrates an example system (e.g., computing device 1000) that may include an IC (e.g., IC 400) as described herein, in accordance with some embodiments. Components of the computing device 1000 may be housed in an enclosure (e.g., housing 1008). The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The processor 1004 of the computing device 1000 may include a die (e.g., die 102 of FIG. 1 and FIG. 2) having an IC (e.g., IC 400 and/or an IC made using the process 300) as described herein. For example, the die 102 of FIG. 2 may be mounted in a package assembly (e.g., package assembly 200) that is mounted on a circuit board such as the motherboard 1002. The term "processor" may refer to any device or portion of a device that processes electronic data from registers and/or memory to transform that electronic data into other electronic data that may be stored in registers and/or memory.

The communication chip 1006 may also include a die (e.g., die 102) having an IC (e.g., IC 400 and/or an IC made using the process 300) as described herein. In further implementations, another component (e.g., memory device or other integrated circuit device) housed within the computing device 1000 may contain a die (e.g., die 102) having an IC (e.g., IC 400 and/or an IC made using the process 300) as described herein.

In various implementations, the computing device 1000 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Some non-limiting Examples of various embodiments are provided below.

Example 1 is an integrated circuit comprising: a plurality of substrate regions formed of a semiconductor and having a first side and a second side; one or more circuit devices formed on the first side of respective substrate regions; a trench disposed between the circuit devices of different substrate regions; and an isolation region disposed between the plurality of substrate regions and extending from the trench to the second side of the plurality of substrate regions.

Example 2 is the integrated circuit of Example 1, wherein the isolation region includes an insulating isolation material.

Example 3 is the integrated circuit of Example 1 or Example 2, wherein the plurality of circuit devices include a plurality of transistors.

Example 4 is the integrated circuit of Example 3, wherein the plurality of transistors include a plurality of fin field-effect transistors (finFETs) that have a semiconductor fin that extends up from the respective substrate region.

Example 5 is the integrated circuit of Example 3, wherein the plurality of transistors include a plurality of planar transistors.

Example 6 is the integrated circuit of Example 3, wherein a plurality of transistors are formed on an individual substrate region of the plurality of substrate regions.

Example 7 is the integrated circuit of Example 3, wherein one or more substrate regions of the plurality of substrate regions include only one transistor formed thereon.

Example 8 is the integrated circuit of Example 1, wherein the isolation region forms an air pocket between the plurality of substrate regions.

Example 9 is a method for producing an integrated circuit comprising: forming a first transistor on a first substrate region of a semiconductor substrate; forming a second transistor on a second substrate region of the semiconductor substrate; forming a trench between the first and second transistors; and removing a portion of the semiconductor substrate between the first and second substrate regions to expose the trench and to form an isolation region between the first and second substrate regions.

Example 10 is the method of Example 9, further comprising forming an insulating isolation material in the isolation region in contact with the trench.

Example 11 is the method of Example 9, further comprising forming a plurality of transistors, including the first transistor, on the first substrate region.

Example 12 is the method of Example 9, further comprising thinning the semiconductor substrate prior to the removing the portion of the semiconductor substrate.

Example 13 is the method of any one of Examples 9 to 12, wherein forming the first transistor includes: forming a semiconductor fin on the first substrate region; and forming a gate on the semiconductor fin.

Example 14 is a computing device comprising: a circuit board; and a die coupled with the circuit board. The die includes: a first transistor formed on a first substrate region of a semiconductor substrate; a second transistor formed on a second substrate region of the semiconductor substrate; a trench disposed between the first and second transistors; and an isolation material disposed between the first and second substrate regions and in contact with the trench, wherein the isolation material completely separates the first and second substrate regions.

Example 15 is the computing device of Example 14, wherein the isolation material is an insulator.

Example 16 is the computing device of Example 14, wherein the trench is in contact with the first and second transistors.

Example 17 is the computing device of Example 14, wherein the first transistor includes: a semiconductor fin that extends up from the first substrate region; and a gate terminal coupled to the semiconductor fin.

Example 18 is the computing device of Example 14, wherein the first and second transistors are planar transistors.

Example 19 is the computing device of Example 14, wherein a plurality of transistors, including the first transistor, are formed on the first substrate region.

Example 20 is the computing device of Example 14, wherein the first transistor is the only transistor formed on the first substrate region.

Example 21 is the computing device of any one of Examples 14 to 20, wherein: the die is a processor; and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit comprising:
    a plurality of substrate regions formed of a semiconductor and having a first side and a second side;
    one or more circuit devices formed on the first side of respective individual substrate regions of the plurality of substrate regions;
    a trench disposed between the one or more circuit devices of the different individual substrate regions; and
    an isolation region disposed between the plurality of substrate regions and extending from the trench to the second side of the plurality of substrate regions, wherein the isolation region includes an insulating isolation material in contact with the trench and with sidewalls of the respective substrate regions that extend between the first side and the second side, wherein the insulating isolation material does not extend across the second side of the respective substrate regions.

2. The integrated circuit of claim 1, wherein the one or more circuit devices include a plurality of transistors.

3. The integrated circuit of claim 2, wherein the plurality of transistors include a plurality of fin field-effect transistors (finFETs) that have a semiconductor fin that extends up from the respective substrate region.

4. The integrated circuit of claim 2, wherein the plurality of transistors include a plurality of planar transistors.

5. The integrated circuit of claim 2, wherein the plurality of transistors include multiple transistors on at least one of the individual substrate regions of the plurality of substrate regions.

6. The integrated circuit of claim 2, wherein one or more substrate regions of the plurality of substrate regions include only one transistor formed thereon.

7. The integrated circuit of claim 1, wherein the insulating isolation material is air.

* * * * *